(12) United States Patent
Tomizawa et al.

(10) Patent No.: US 9,142,744 B2
(45) Date of Patent: Sep. 22, 2015

(54) SEMICONDUCTOR LIGHT EMITTING DEVICE AND METHOD FOR MANUFACTURING SAME

(71) Applicant: KABUSHIKI KAISHA TOSHIBA, Minato-ku, Tokyo (JP)

(72) Inventors: Hideyuki Tomizawa, Kanagawa-ken (JP); Akihiro Kojima, Kanagawa-ken (JP); Miyoko Shimada, Kanagawa-ken (JP); Yosuke Akimoto, Tokyo (JP); Yoshiaki Sugizaki, Kanagawa-ken (JP); Hideto Furuyama, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/847,426

(22) Filed: Mar. 19, 2013

(65) Prior Publication Data
US 2014/0217438 A1 Aug. 7, 2014

(30) Foreign Application Priority Data
Feb. 1, 2013 (JP) ................. 2013-018955

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2224/13* (2013.01)

(58) Field of Classification Search
CPC ............................... H01L 33/00; H01L 21/50
USPC ....................... 257/99, 98, E33.056, E33.061, 257/E33.067; 438/26, 27
See application file for complete search history.

(56) References Cited

U.S. PATENT DOCUMENTS

| 6,366,431 B1 * | 4/2002 | Tsuchiya et al. ............... 360/245 |
| 6,415,507 B1 * | 7/2002 | Shimosato et al. .......... 29/890.1 |
| 2010/0148198 A1 * | 6/2010 | Sugizaki et al. ................ 257/98 |

(Continued)

FOREIGN PATENT DOCUMENTS

| TW | 201031033 A | 8/2010 |
| TW | 201133942 A | 10/2011 |
| TW | 201244183 A | 11/2012 |

OTHER PUBLICATIONS

Taiwanese Office Action dated Oct. 23, 2014, issued in counterpart Taiwanese Application No. 102108632.

(Continued)

*Primary Examiner* — Sheng Zhu
(74) *Attorney, Agent, or Firm* — Holtz, Holtz, Goodman & Chick PC

(57) ABSTRACT

According to one embodiment, a semiconductor light emitting device includes: a semiconductor layer; a first electrode; a first interconnection layer; a second electrode; a second interconnection layer; a support substrate; a bonding layer; a first terminal; and a second terminal. The support substrate has a third face facing the semiconductor layer, the first interconnection layer, and the second interconnection layer and a fourth face opposite to the third face. The support substrate has a first opening extending from the fourth face to the first interconnection layer and a second opening extending from the fourth face to the second interconnection layer. The bonding layer is provided between the support substrate and each of the semiconductor layer, the first interconnection layer, and the second interconnection layer.

10 Claims, 19 Drawing Sheets

(56) References Cited

U.S. PATENT DOCUMENTS

| | | | |
|---|---|---|---|
| 2011/0073890 A1* | 3/2011 | Sugizaki et al. | 257/98 |
| 2011/0136342 A1* | 6/2011 | Harada et al. | 438/675 |
| 2011/0193123 A1* | 8/2011 | Moon et al. | 257/98 |
| 2012/0074441 A1 | 3/2012 | Seo et al. | |
| 2012/0138988 A1 | 6/2012 | Lee et al. | |
| 2013/0026518 A1 | 1/2013 | Suh et al. | |
| 2014/0061709 A1 | 3/2014 | Suh et al. | |

OTHER PUBLICATIONS

Taiwanese Office Action dated Apr. 7, 2015, issued in counterpart Taiwanese Application No. 102108632.

* cited by examiner

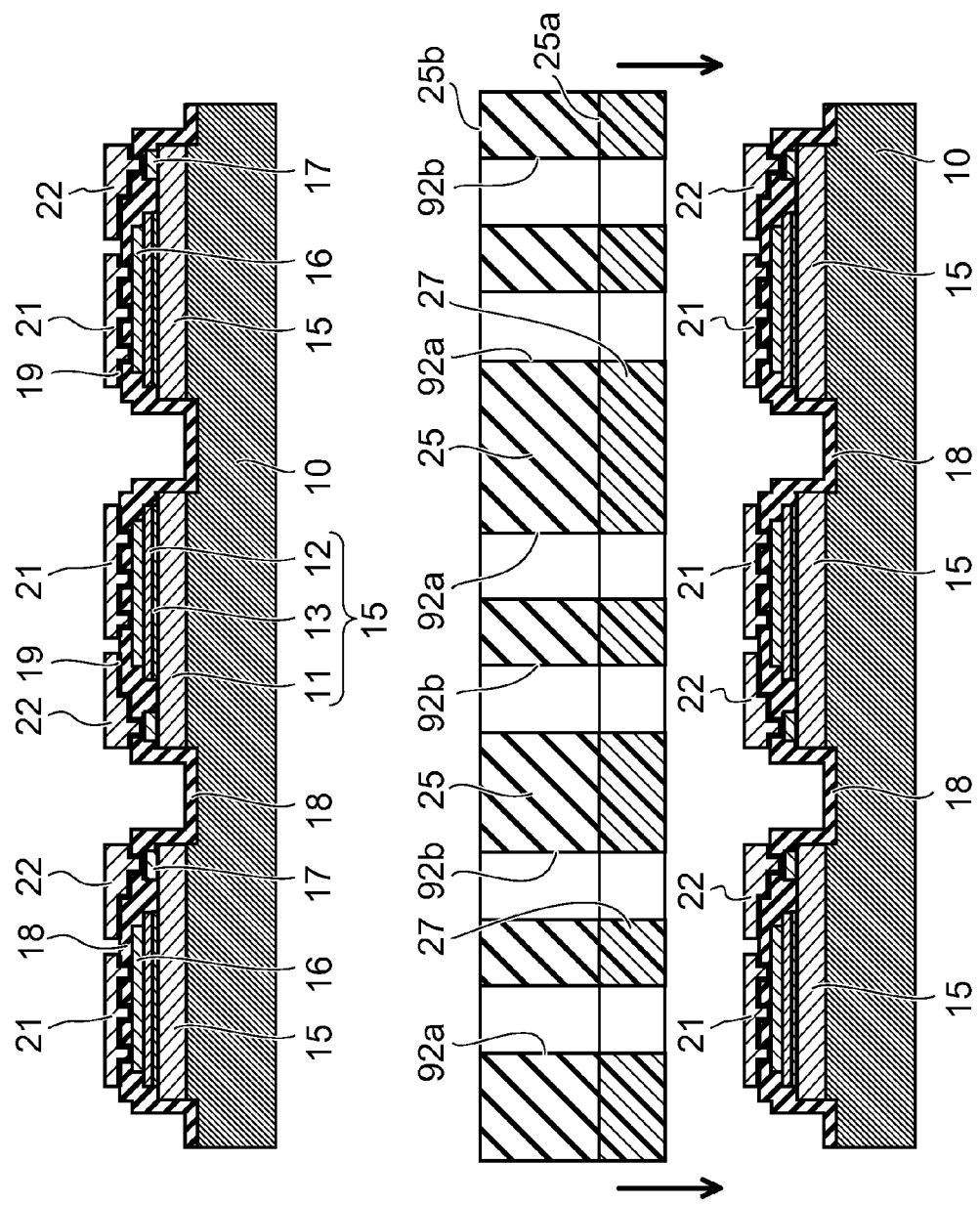

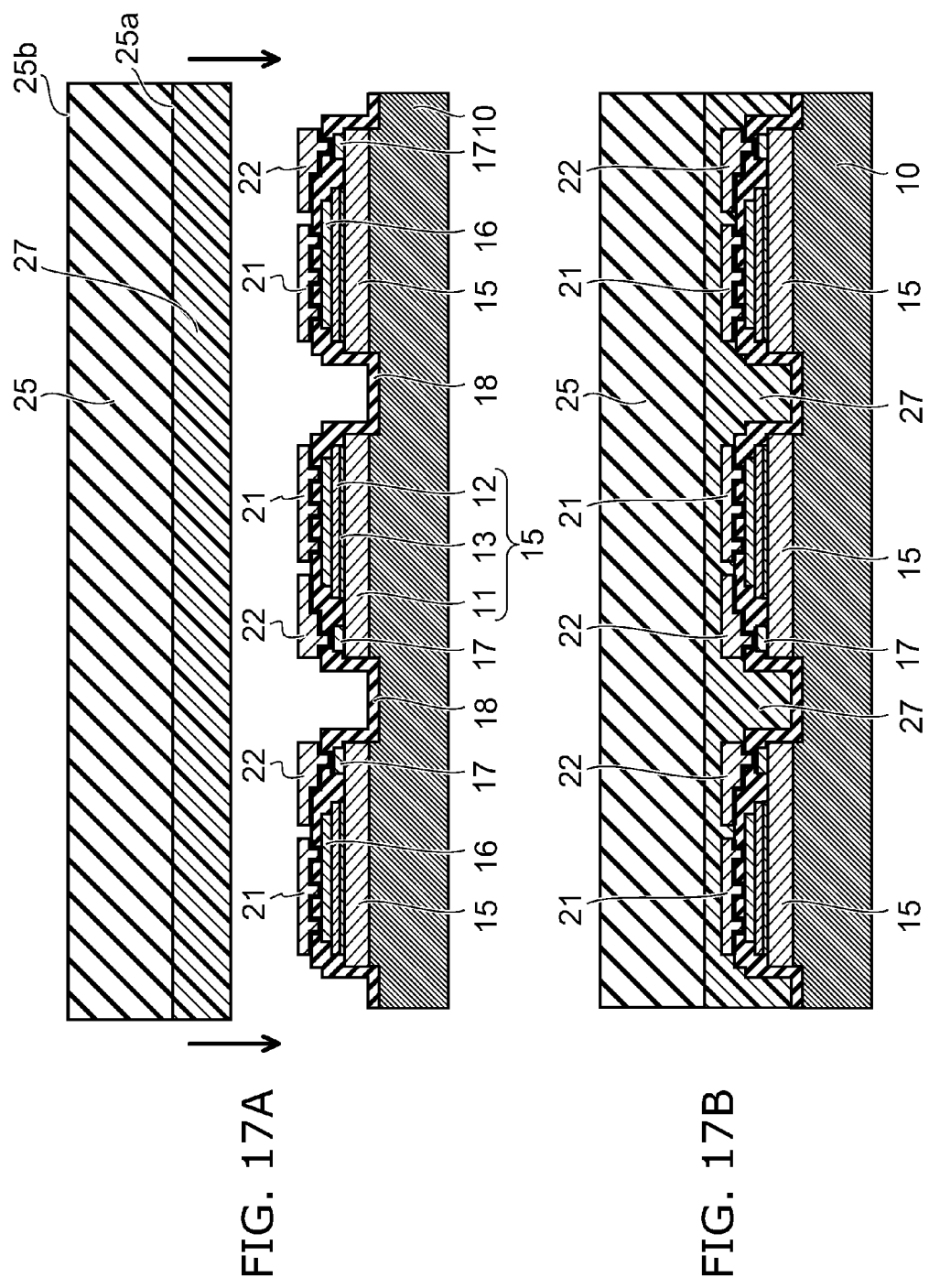

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2013-018955, filed on Feb. 1, 2013; the entire contents of which are incorporated herein by reference.

FIELD

Embodiments described herein relate generally to a semiconductor light emitting device and a method for manufacturing same.

BACKGROUND

A semiconductor light emitting device that emits visible light such as white light or light in other wavelength ranges by combining a semiconductor light emitting element and a phosphor is expanding the use as a small, easy-to-handle light source. To obtain an extremely small size device, a resin package enclosing a semiconductor layer has been developed, in which the semiconductor layer is separated from a substrate, and includes a light emitting layer. However, in the manufacturing processes of such a device, manufacturing yields and manufacturing efficiency may be reduced due to the warpage of the wafer including the semiconductor layer separated from the substrate.

BRIEF DESCRIPTION OF THE DRAWINGS

FIG. 2A to FIG. 12B are schematic views showing manufacturing processes of the semiconductor light emitting device according to the first embodiment;

FIG. 17A to FIG. 19B are schematic cross-sectional views showing manufacturing processes of a semiconductor light emitting device according to a second embodiment.

DETAILED DESCRIPTION

Figure 1:
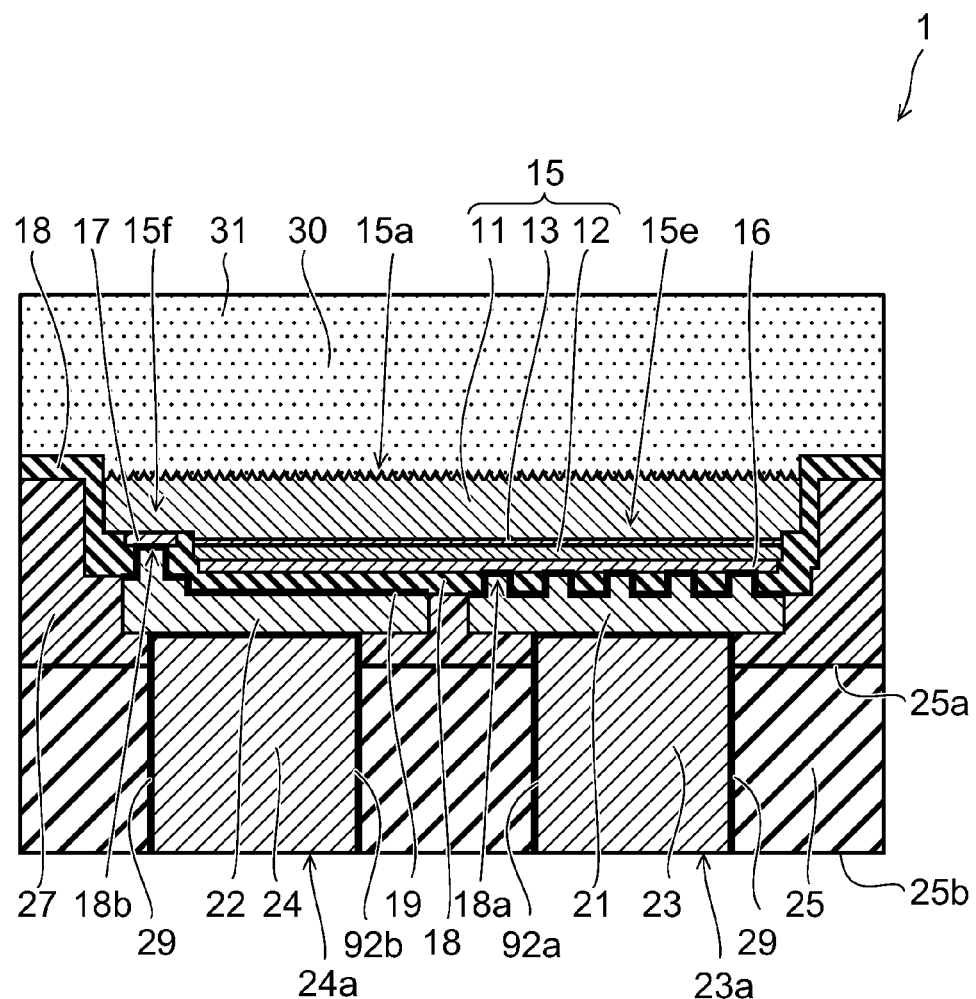
FIG. 1 is a schematic cross-sectional view of a semiconductor light emitting device according to a first embodiment.

According to one embodiment, a semiconductor light emitting device includes: a semiconductor layer having a first face and a second face opposite to the first face and including a light emitting layer; a first electrode provided on the second face side of the semiconductor layer; a first interconnection layer electrically connected to the first electrode on the second face side; second electrode provided on the second face side of the semiconductor layer; a second interconnection layer electrically connected to the second electrode on the second face side; a support substrate having a third face facing the semiconductor layer, the first interconnection layer, and the second interconnection layer and a fourth face opposite to the third face and having a first opening extending from the fourth face to the first interconnection layer and a second opening extending from the fourth face to the second interconnection layer; a bonding layer provided between the support substrate and each of the semiconductor layer, the first interconnection layer, and the second interconnection layer; a first terminal electrically connected to the first interconnection layer via the first opening; and a second terminal electrically connected to the second interconnection layer via the second opening.

According to another embodiment, a method for manufacturing a semiconductor light emitting device is provided. The method includes: forming a first electrode and a second electrode on a semiconductor layer provided on a first substrate, the semiconductor layer including a light emitting layer; forming a first interconnection layer electrically connected to the first electrode on the semiconductor layer; forming a second interconnection layer electrically connected to the second electrode on the semiconductor layer; attaching a second substrate via a bonding layer onto the semiconductor layer, the first interconnection layer and the second interconnection layer, the second substrate having a first opening communicating with the first interconnection layer and a second opening communicating with the second interconnection layer; forming a first terminal electrically connected to the first interconnection layer via the first opening and a second terminal electrically connected to the second interconnection layer via the second opening; and removing the first substrate from the semiconductor layer.

Hereinbelow, embodiments are described with reference to the drawings. Identical components in the drawings are marked with the same reference numerals, and a detailed description thereof is omitted as appropriate and different components are described. The drawings are illustrated schematically or conceptually; and the relationships between the thickness and width of portions, the size proportions among portions, etc. shown in the drawings are not necessarily the same as the actual values thereof. Further, the dimensions and proportions may be illustrated differently among drawings, even for identical portions.

In the following description, the first electrode, the first interconnection layer, the first metal pillar and the first interconnection are explained respectively as a p-side electrode, a p-side interconnection layer, a p-side metal pillar and a p-side interconnection. The second electrode, the second interconnection layer, the second metal pillar and the second interconnection are explained respectively as an n-side electrode, an n-side interconnection layer, an n-side metal pillar and an n-side interconnection. Alternatively, it may be possible to change the conductivity, such that the first electrode serves as an n-side electrode, and the second electrode serves as a p-side electrode.

First Embodiment

FIG. 1 is a schematic cross-sectional view of a semiconductor light emitting device 1 according to a first embodiment.

The semiconductor light emitting device 1 includes a semiconductor layer 15 including a light emitting layer 13. The semiconductor layer 15 has a first face 15a and a second face 15b opposite to the first face 15a (see FIG. 3A). The semiconductor layer 15 has a luminous portion 15e and a non-luminous portion 15f. For example, the luminous portion 15e includes the light emitting layer 13.

On the second face 15a side, a p-side electrode 16 is provided on the luminous portion 15e, and an n-side electrode 17 is provided on the non-luminous portion 15f. The light emitting layer 13 emits light by the current flow between the p-side electrode 16 and the n-side electrode 17. The light emitted from the light emitting layer 13 is radiated outwards through the first face 15a.

The semiconductor light emitting device 1 includes the p-side interconnect layer 21 and the n-side interconnect layer 22 on the side of the second face 15b. The p-side interconnect layer 21 is electorically connected to the p-side electrode 16. The n-side interconnect layer 22 is electorically connected to the n-side electrode 17.

The semiconductor light emitting device 1 further includes a support substrate 25 on the second face side. The support substrate 25 has a third face 25a facing the semiconductor layer 15, the p-side interconnection layer 21, and the n-side interconnection layer 22 and a fourth face 25b opposite to the third face 25a. The support substrate 25 has a first opening (hereinafter, an opening 92a) extending from the fourth face 25b to the p-side interconnection layer 21 and a second opening (hereinafter, an opening 92b) extending from the fourth face 25b to the n-side interconnection layer 22.

A bonding layer 27 is provided between the support substrate 25 and each of the semiconductor layer 15, the p-side interconnection layer 21, and the n-side interconnection layer 22. A p-side terminal 23a and an n-side terminal 24a are provided on the fourth face 25b side. The p-side terminal 23a is electrically connected to the p-side interconnection layer 21 via the opening 92a. The n-side terminal 24a is electrically connected to the n-side interconnection layer 22 via the opening 92b.

The structure of the semiconductor light emitting device 1 will now be described in detail with reference to FIG. 1.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, an underlying buffer layer and an n-type GaN layer. The second semiconductor layer 12 is, for example, a p-type GaN layer. The light emitting layer 13 contains a material that emits blue light, violet light, bluish violet light, ultraviolet light, etc.

The second face 15b of the semiconductor layer 15 is provided with convex and concave portions. The convex portion is the portion 15e where the light emitting layer 13 is stacked, and the concave portion is the portion 15f where the light emitting layer 13 is not stacked. The second face 15b of the portion 15e is a surface of the second semiconductor layer 12 that has p-type conductivity. The second face 15b of the portion 15f is a surface of the first semiconductor layer 11 that has n-type conductivity. Thus, the p-side electrode 16 contacts the p-type semiconductor, and the n-side electrode contacts the n-type semiconductor.

In the second face 15b of the semiconductor layer 15, for example, the area of the portion 15e including the light emitting layer 13 is provided larger than the area of the portion 15f not including the light emitting layer 13. The area of the p-side electrode 16 provided on the portion 15e is larger than the area of the n-side electrode 17 provided on the portion 15e. Thereby, a large light emitting face is obtained, and the light output can be increased.

A first insulating film (hereinafter, an insulating film 18) is provided on the second face side of the semiconductor layer 15. The insulating film 18 covers the semiconductor layer 15, the p-side electrode 16, and the n-side electrode 17. The insulating film 18 is not provided on the first face 15a of the semiconductor layer 15.

As the insulating film 18, for example, an inorganic film such as a silicon oxide film and a silicon nitride film is used. Alternatively, a resin such as a polyimide may be used, which has excellent patternability of minute openings. In the case where a resin is used as the insulating film 18, for example, an inorganic film such as a silicon oxide film may be provided between the insulating film 18 and the semiconductor layer 15. The inorganic film covers and protects the side faces of the light emitting layer 13 and the second semiconductor layer 12.

A p-side interconnection layer 21 and an n-side interconnection layer 22 are provided away from each other on the insulating film 18 on the opposite side to the semiconductor layer 15. The insulating film 18 includes a first opening (hereinafter, an opening 18a) communicating with the p-side electrode 16 and a second opening (hereinafter, an opening 18b) communicating with the n-side electrode 17. Although the insulating film 18 includes a plurality of openings 18a shown in FIG. 1, the embodiment is not limited thereto. It may also be possible to use an insulating film 18 having one opening 18a.

The p-side interconnection layer 21 is provided on the insulating film 18 and also in the opening 18a. That is, the p-side interconnection layer 21 is electrically connected to the p-side electrode 16 via the opening 18a. The n-side interconnection layer 22 is provided on the insulating film 18 and also in the opening 18b, and is electrically connected to the n-side electrode 17.

In the embodiment, a metal film 19 is provided between the p-side interconnection layer 21 and the insulating film 18 and between the n-side interconnection layer 22 and the insulating film 18. As described later (see FIG. 5B to FIG. 6A), the metal film 19 is used as a seed metal in the plating process for forming each interconnection layer. When the metal film 19 is provided with the same material as the p-side interconnection layer 21 and the n-side interconnection layer 22, there is a case where the metal film 19 and each interconnection layer are joined into one body and cannot be distinguished from each other. The metal film 19 may not be provided in the case where the p-side interconnection layer 21 and the n-side interconnection layer 22 are formed by using a method other than the plating.

The support substrate 25 is attached onto the semiconductor layer 15, the p-side interconnection layer 21, and the n-side interconnection layer 22 via the bonding layer 27. The support substrate 25 has the opening 92a and the opening 92b communicating with the p-side interconnection layer 21 and the n-side interconnection layer 22, respectively. A p-side metal pillar 23 and an n-side metal pillar 24 are provided in the opening 92a and in the opening 92b, respectively.

The p-side metal pillar 23 and the n-side metal pillar 24 are exposed at the fourth face 25b on the opposite side of the support substrate 25 from the third face 25a facing the semiconductor layer 15, the p-side interconnection layer 21, and the n-side interconnection layer 22. The end faces of the p-side metal pillar 23 and the n-side metal pillar 24 serve as the p-side terminal 23a and the n-side terminal 24a, respectively. The p-side terminal 23a and the n-side terminal 24a are bonded to the land pattern of a mounting substrate via a solder or a conductive bonding material, for example.

The semiconductor light emitting device 1 further includes a phoshor layer 30. The phospher layer 30 contains phosphor 31. The phospher 31 is excited by the light emitted from the light emitting layer 13, and emits light having different wavelength from the exciting light. That is, a peak wavelength in a light spectrum of the phosphor 31 is longer than a peak wavelength in a light spectrum of the light emitting layer 13.

The phosphor layer 30 covers the fine concavity and convexity provided in the first face 15a of the semiconductor layer 15. That is, the semiconductor layer 15 has the concavity and convexity formed by using wet etching with a alkaline aqueous solution. Thereby, it becomes possible to suppress the total reflection of the light, and to efficiently extract the light outwards, which is emitted from the light emitting layer 13.

Next, a method for manufacturing the semiconductor light emitting device 1 according to the embodiment is described with reference to FIG. 2A to FIG. 12B. FIG. 2A to FIG. 12B are schematic views showing the manufacturing processes of the semiconductor light emitting device 1 according to the embodiment.

Figure 2A:
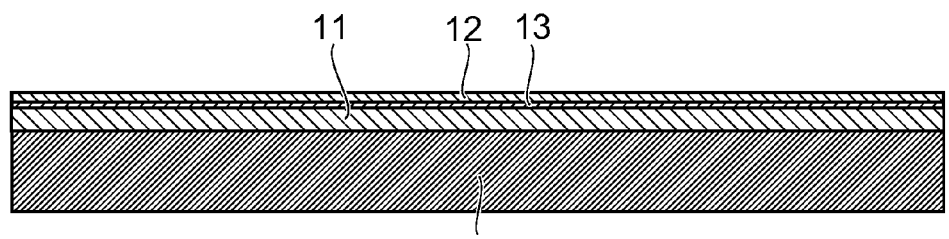

FIG. 2A is a cross-sectional view showing the first semiconductor layer 11, the second semiconductor layer 12, and the light emitting layer 13 formed on the major face of the substrate 10. For example, the MOCVD (metal organic chemical vapor deposition) method is used to sequentially grow the first semiconductor layer 11, the light emitting layer 13, and the second semiconductor layer 12 on the substrate 10. The substrate is, for example, a silicon substrate. Also a sapphire substrate may be used as the substrate 10. The first semiconductor layer 11, the light emitting layer 13, and the second semiconductor layer 12 are, for example, a nitride semiconductor and contains gallium nitride (GaN).

The first semiconductor layer 11 is, for example, an n-type GaN layer. The first semiconductor layer 11 may have a stacked structure including a buffer layer provided on the substrate 10 and an n-type GaN layer provided on the buffer layer. The second semiconductor layer 12 includes, for example, a p-type AlGaN layer provided on the light emitting layer 13 and a p-type GaN layer provided on the p-type AlGaN layer.

Figure 2B:
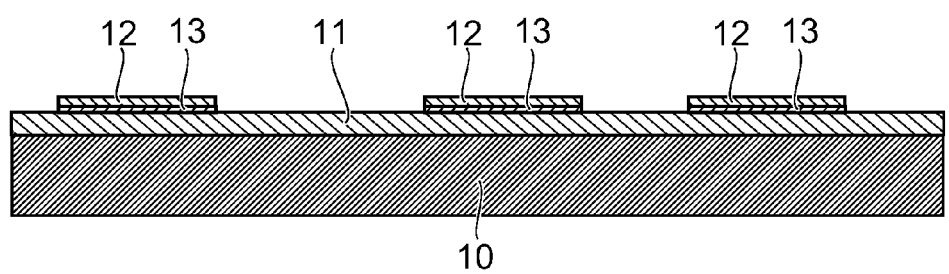
Figure 2C:
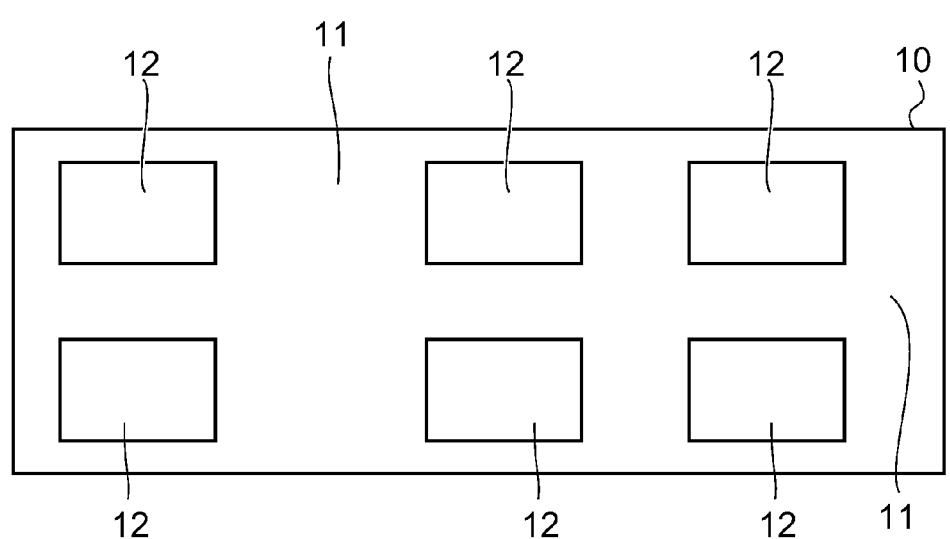

FIG. 2B and FIG. 2C show a state where the second semiconductor layer 12 and the light emitting layer 13 are selectively removed. FIG. 2B is a cross-sectional view, and FIG. 2C is a plan view showing the upper face side of the substrate 10.

As shown in FIG. 2B, for example, the RIE (reactive ion etching) method is used to selectively etch the second semiconductor layer 12 and the light emitting layer 13 to expose the first semiconductor layer 11.

As shown in FIG. 2C, the semiconductor layer 12 and the light emitting layer 13 are patterned into an island configuration, and a plurality of luminous portions 15e are formed on the substrate 10.

Figure 3A:
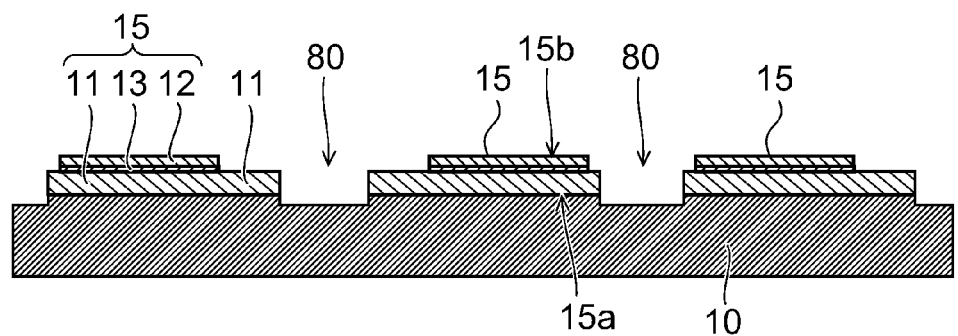
Figure 3B:
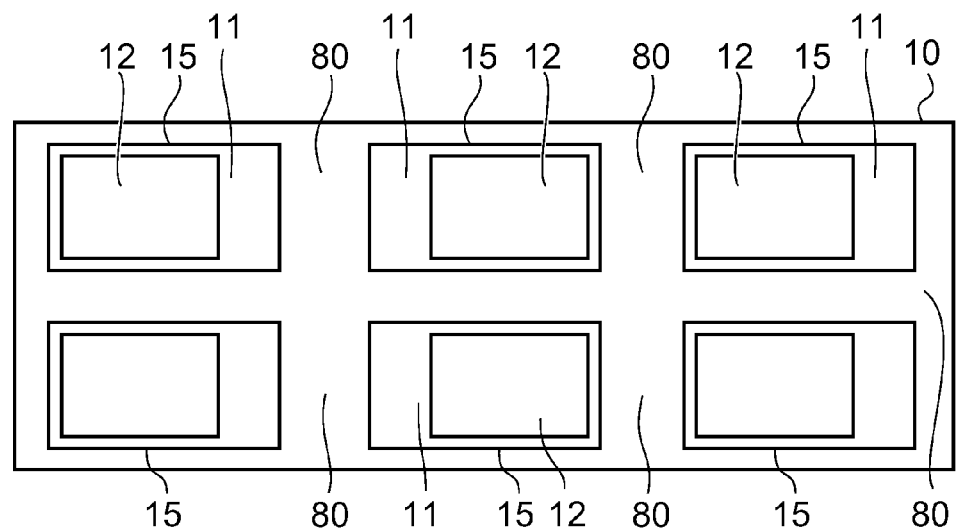

Next, as shown in FIG. 3A and FIG. 3B, the first semiconductor layer 11 is selectively removed to form a plurality of semiconductor layers 15 on the substrate 10.

FIG. 3A shows a cross-section of the substrate 10 and the semiconductor layer 15 formed thereon. For example, an etching mask (not shown) covering the second semiconductor layer 12 and the light emitting layer 13 is provided on the first semiconductor layer 11. Subsequently, the RIE method is used to etch the first semiconductor layer 11 to form a trench 80 with a depth reaching the substrate 10.

FIG. 3B shows the upper face of the substrate 10 provided with the semiconductor layer 15. The trench 80 is provided in a lattice configuration on the substrate 10, and separates the first semiconductor layer 11 to form a plurality of semiconductor layers 15.

The first face 15a of the semiconductor layer 15 is a face in contact with the substrate 10, and the second faces 15b are the faces of the first semiconductor layer 11 and the second semiconductor layer 12. The trench 80 is formed by etching the upper face of the substrate 10, and is provided in a position deeper than the first face 15a.

Figure 9A:
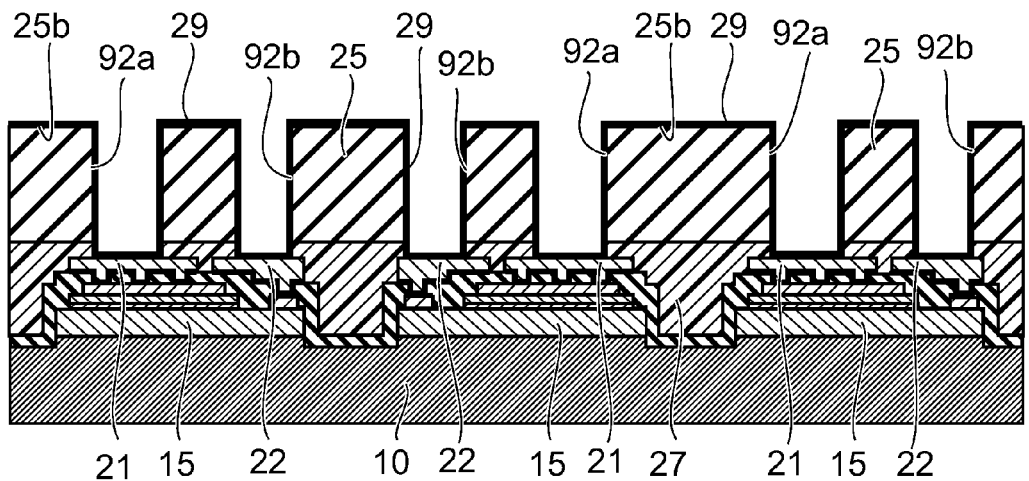
Figure 9B:
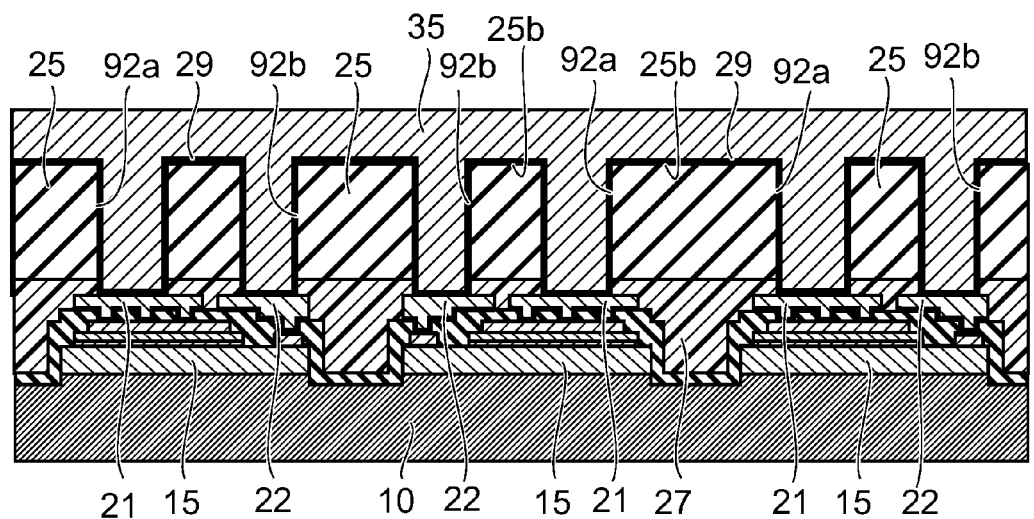

The trench 80 may be formed after the p-side electrode 16 and the n-side electrode 17 are formed (see FIGS. 9A and 9B).

Figure 4A:
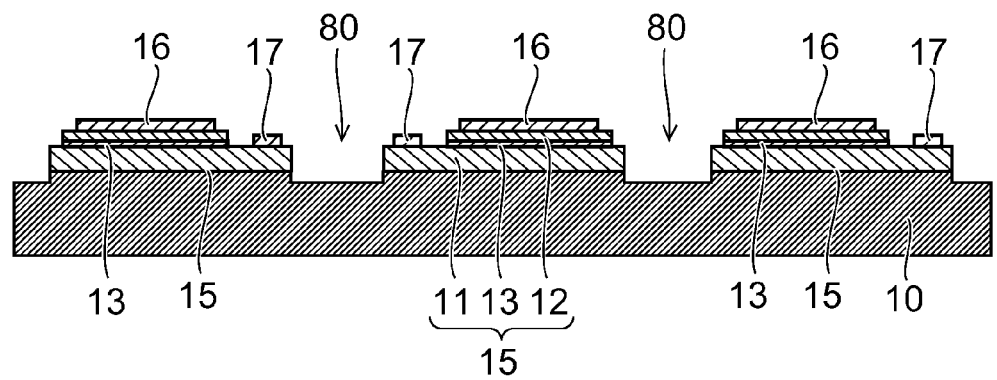
Figure 4B:
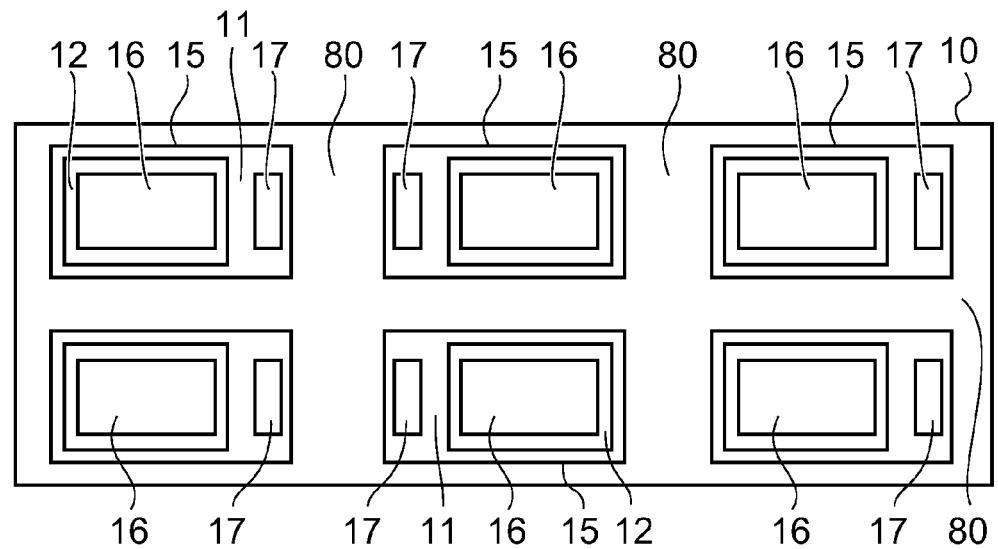

Next, as shown in FIG. 4A and FIG. 4B, the p-side electrode 16 and the n-side electrode 17 are formed on the second face 15b of the semiconductor layer 15. FIG. 4A is a cross-sectional view, and FIG. 4B is a plan view showing the upper face of the substrate 10.

The p-side electrode 16 is formed on the second semiconductor layer 12. The n-side electrode 17 is formed on the first semiconductor layer 11. The p-side electrode 16 has a larger area than the n-side electrode.

The p-side electrode 16 and the n-side electrode 17 are formed by, for example, the sputtering method, the vapor deposition method, or the like. The p-side electrode 16 and the n-side electrode 17 may be formed sequentially, or may be formed simultaneously using the same material. The p-side electrode 16 is formed so as to reflect the emission light of the light emitting layer 13. The p-side electrode 16 contains, for example, silver, a silver alloy, aluminum, an aluminum alloy, or the like. To prevent the sulfuration and oxidation of the p-side electrode 16, a metal protection film (barrier metal) may be included therein. To form an ohmic contact between each electrode and the semiconductor layer, heat treatment is performed as necessary.

Figure 5A:
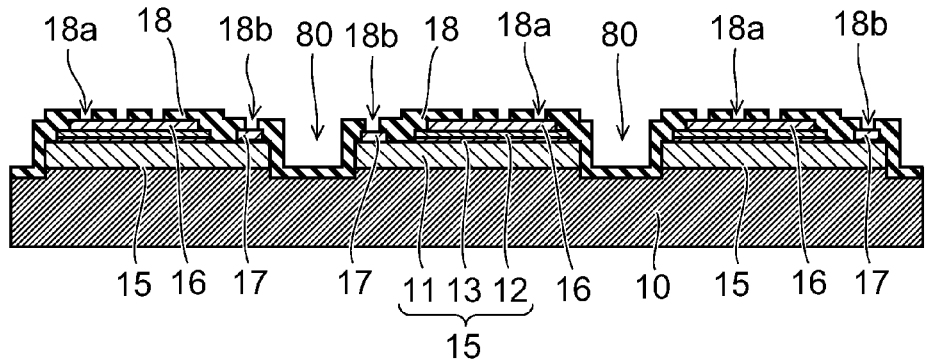

Next, as shown in FIG. 5A, the insulating film 18 is formed on the upper face of the substrate 10. FIG. 5A is a schematic view showing a cross-section of the substrate 10 and the semiconductor layer 15. The insulating film 18 covers the structure provided on the substrate 10, and has the first opening and the second opening.

The insulating film 18 is, for example, a silicon oxide film or a silicon nitride film, and may be formed using the CVD (chemical vapor deposition) method. The openings 18a and 18b are formed by, for example, wet etching using a resist mask. The opening 18a is in communication with the p-side electrode 16. The opening 18b is in communication with the n-side electrode 17. In the embodiment, the insulating film 18 includes a plurality of openings 18a and one opening 18b.

Also an organic film of a polyimide or the like, for example, may be used as the insulating film 18. When an organic film of a photosensitive polyimide, benzocyclobutene, or the like is used for the insulating film 18, direct exposure and development can be performed. Therefore, the patterning of the openings 18a and 18b may become easier.

Next, FIG. 5B to FIG. 6B show the formation processes of the p-side interconnection layer 21 and the n-side interconnection layer 22. FIG. 10B to FIG. 11A are schematic views showing a cross-section of the substrate 10 and the semiconductor layer 15, and FIG. 11A is a plan view showing the upper face of the substrate 10.

Figure 5B:
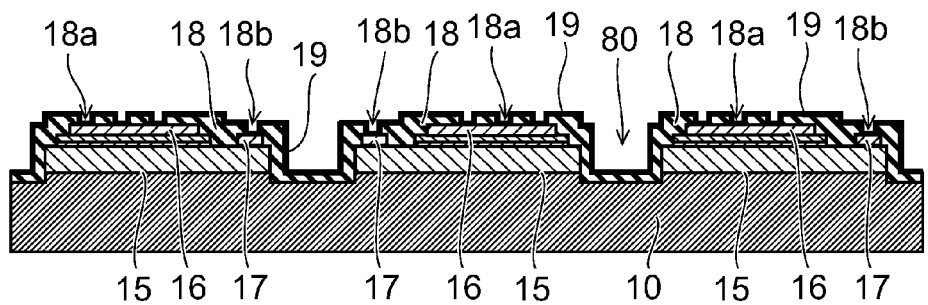

As shown in FIG. 5B, a metal film 19 is formed on the insulating film 18, the inner face (side wall and bottom face) of the first opening 18a, and the inner face (side wall and bottom face) of the second opening 18b. The metal film 19 serves as a seed metal in the plating process.

The metal film 19 is, for example, formed using the sputtering method so as to contain titanium (Ti) and copper (Cu) in this order from the insulating film 18 side. Aluminum may be used in place of titanium.

Figure 5C:
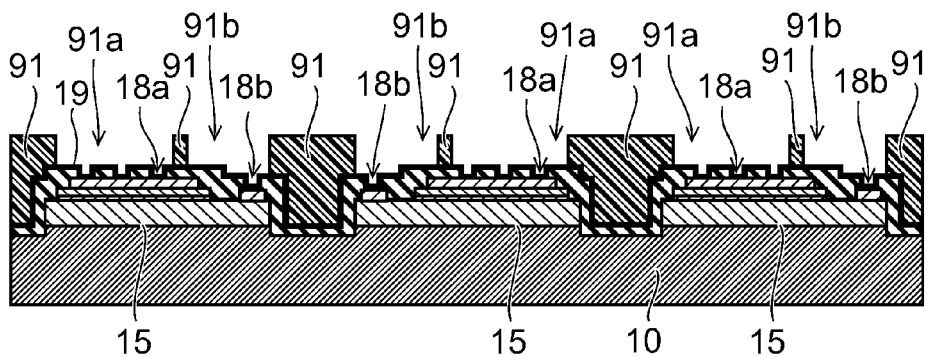

Next, as shown in FIG. 5C, a resist mask 91 is formed on the metal film 19. The resist mask 91 includes an opening 91a and an opening 91b. The opening 91a is provided on the p-side electrode 16, and the opening 91b is provided on the n-side electrode 17.

Figure 6A:
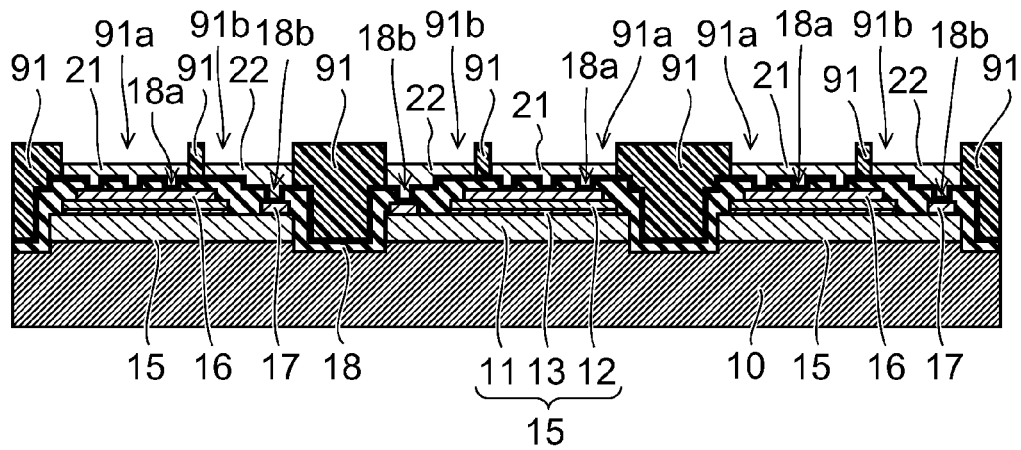
Figure 6B:
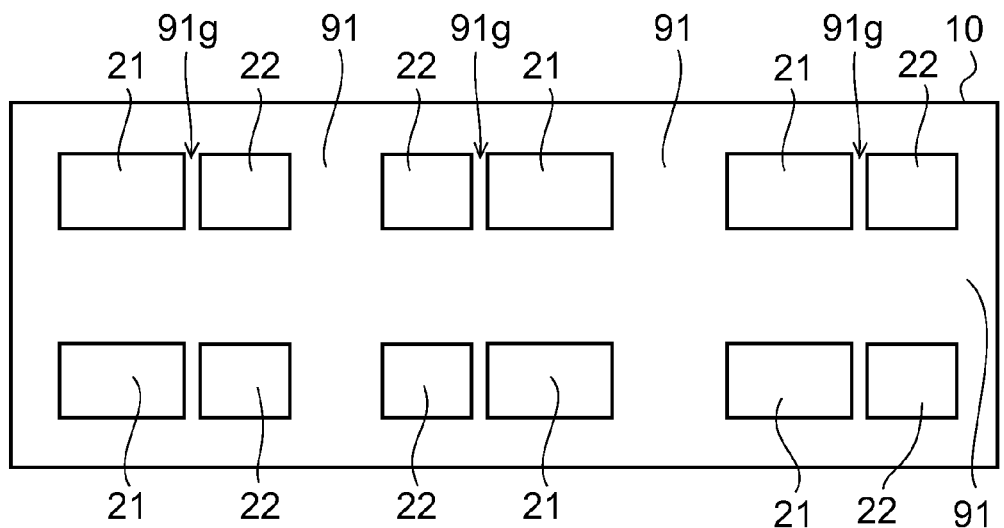

Subsequently, as shown in FIG. 6A and FIG. 6B, the p-side interconnection layer 21 and the n-side interconnection layer 22 are formed using electrolytic copper plating. That is, using the metal film 19 as a current path, a copper (Cu) layer is selectively formed in the openings 91a and 91b of the resist mask 91.

As shown in FIG. 6A, the p-side interconnection layer 21 is formed on the insulating film 18 and also in the opening 18a. The p-side interconnection layer 21 is electrically connected to the p-side electrode 16. The n-side interconnection layer 22 is formed on the insulating film 18 and also in the opening 18b. The n-side interconnection layer 22 is electrically connected to the n-side electrode 17.

As shown in FIG. 6B, the p-side interconnection layer 21 and the n-side interconnection layer 22 face each other across a resist mask 91g. That is, the p-side interconnection layer 21 and the n-side interconnection layer 22 may be provided with narrow spacing up to the limit of photolithography.

Figure 8A:
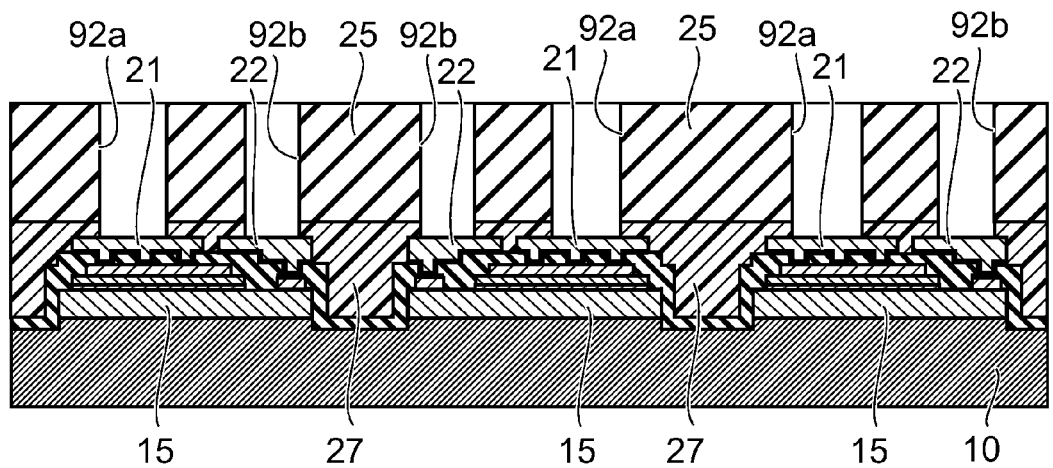
Figure 8B:
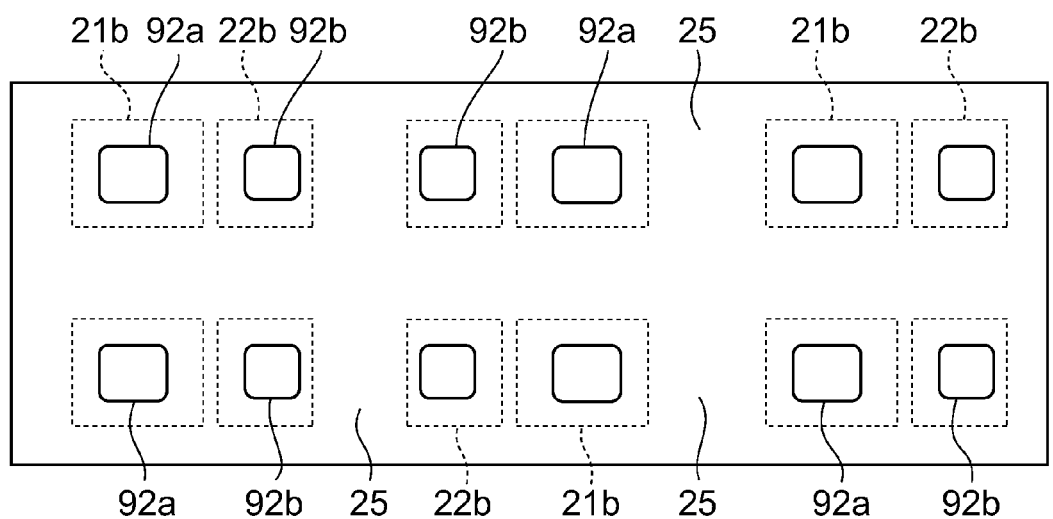

FIG. 7A to FIG. 8B are schematic views showing the processes of attaching a second substrate (hereinafter, the support substrate 25) onto the semiconductor layer 15, the p-side interconnection layer 21, and the n-side interconnection layer 22. FIG. 7A to FIG. 8A are schematic cross-sectional views showing the attaching processes, and FIG. 8B is a plan view showing the fourth face 25b of the support substrate 25.

As shown in FIG. 7A, the resist mask 91 is removed using, for example, wet processing, and further the metal film 19 is removed. The metal film 19 can be removed using, for example, wet etching using the p-side interconnection layer 21 and the n-side interconnection layer 22 as a mask. Thereby, the p-side interconnection layer 21 and the n-side interconnection layer 22 are electrically isolated from each other.

Next, as shown in FIG. 7B, the support substrate 25 having the bonding layer 27 on the third face 25a is attached onto the semiconductor layer 15, the p-side interconnection layer 21, and the n-side interconnection layer 22.

The support substrate 25 is, for example, quartz glass with a thickness of 0.5 to 1 millimeter (mm). The bonding layer 27 is so-called "a B stage resin" in a semi-cured state, and contains, for example, an epoxy resin or a silicone as a main component. Also sapphire or a hard resin such as an acrylic and a polycarbonate may be used as the support substrate 25.

In the support substrate 25, the openings 92a and 92b are formed beforehand. When the support substrate 25 is bonded onto the substrate 10, the openings 92a and 92b are aligned with the positions of the p-side interconnection layer 21 and the n-side interconnection layer 22, respectively. That is, the openings 92a and 92b are formed such that the areas and arrangement positions thereof are matched with the areas and positions of the p-side interconnection layer 21 and the n-side interconnection layer 22, respectively. Thereby, the openings 92a and 92b can be provided extending from the fourth face 25b side of the support substrate 25 to the p-side interconnection layer 21 and the n-side interconnection layer 22, respectively.

FIG. 8A and FIG. 8B show the support substrate 25 attached onto the semiconductor layer 15, the p-side interconnection layer 21, and the n-side interconnection layer 22.

For example, the support substrate 25 is pressure-bonded onto the substrate 10, and the space between adjoining semiconductor layers 15 is filled with the bonging layer 27. Subsequently, heat treatment of a prescribed temperature is performed to cure the bonding layer 27 to bond the substrate 10 and the support substrate 25. When the substrate 10 and the support substrate 25 are bonded, the bonding layer 27 around the semiconductor layer 15 is preferably thicker than the portion where the semiconductor layer 15, the p-side electrode 16, and the p-side interconnection layer 21 are stacked. Thereby, the occurrence of voids etc. can be suppressed between the support substrate 25 and the substrate 10.

As shown in FIG. 8B, the openings 92a and 92b preferably comunicating with the inside of the outer edge 21b of the p-side interconnection layer 21 and the inside of the outer edge 22b of the n-side interconnection layer 22, respectively. Thereby, the alignment of the opening 92a with the p-side interconnection layer 21 and the alignment of the opening 92b with the n-side interconnection layer 22 becomes easier, and a short circuit between the p-side interconnection layer 21 and the n-side interconnection layer 22 can be prevented.

Figure 10A:
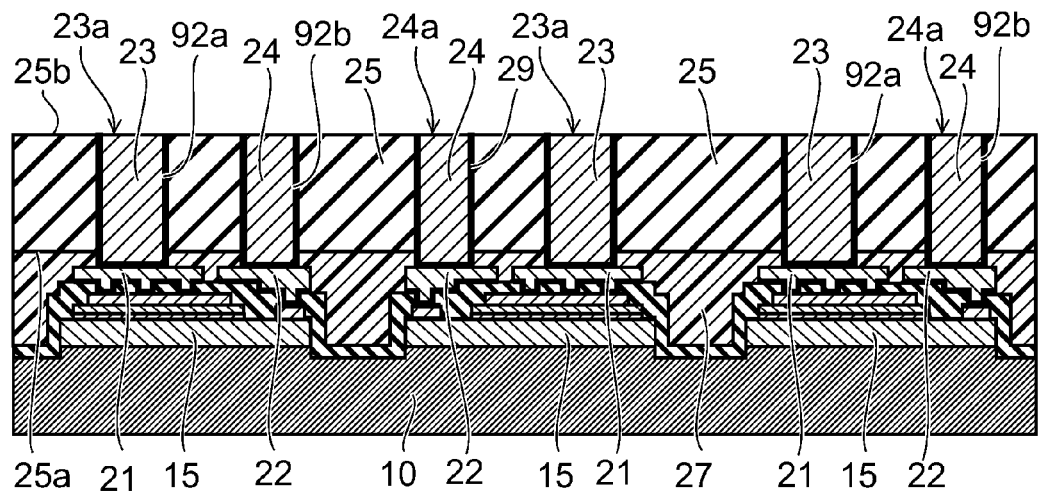
Figure 10B:
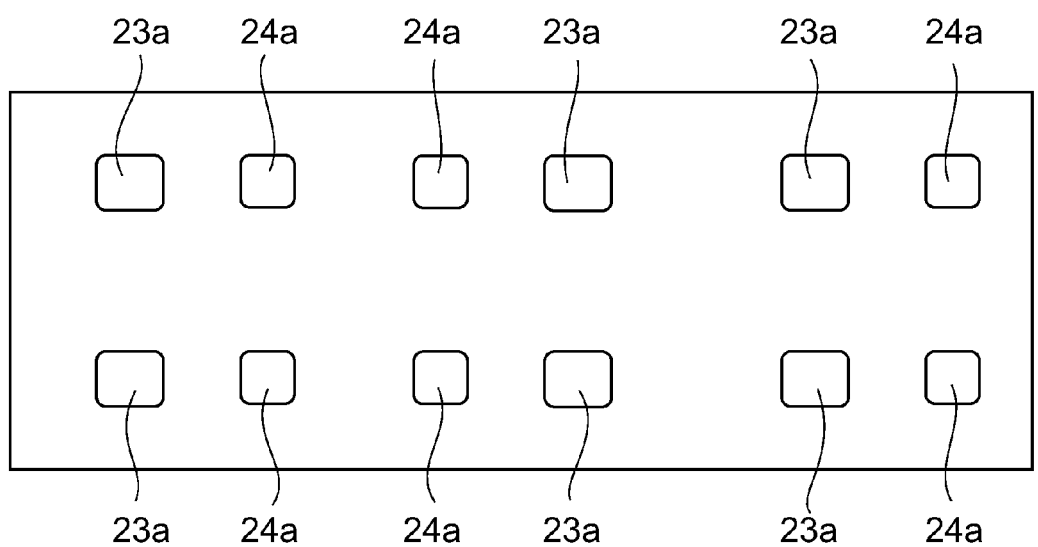
Figure 11A:
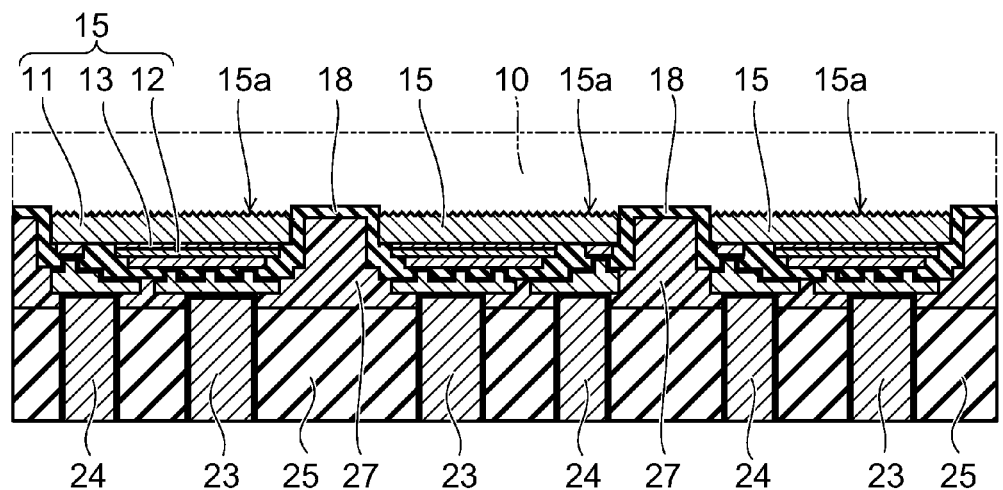

FIG. 9A to FIG. 10B are schematic views showing the processes of forming the p-side metal pillar 23 and the n-side metal pillar 24 in the openings 92a and 92b. FIG. 9A to FIG. 10A are schematic cross-sectional views showing the formation processes of the p-side metal pillar 23 and the n-side metal pillar 24. FIG. 10B is a plan view showing the fourth face 25b of the support substrate 25.

As shown in FIG. 9A, a metal film 29 is formed covering the fourth face 25b of the support substrate 25, the inner face of the opening 92a, and the inner face of the opening 92b. The metal film 29 contains, for example, titanium (Ti) and copper (Cu) in this order from the support substrate 25 side. Nickel or aluminum may be used in place of titanium.

Next, as shown in FIG. 9B, the metal film 29 is used as a seed metal to perform electrolytic Cu plating to fill up the interior of the opening 92a and the interior of the opening 92b; thus, a Cu layer 35 is formed covering the fourth face 25b.

When the metal film 29 is provided with the same material as the Cu layer 35, the metal film 29 and the Cu layer 35 are formed into one body after plating. The metal film 29 may not be formed in the case where a method other than the plating is used to form the Cu layer 35.

Subsequently, as shown in FIG. 10A, for example, the Chemical Mechanical Polishing (CMP) method is used to grind the Cu layer 35 and the metal film 29 to remove the portion covering the fourth face 25b, leaving the portions buried in the openings 92a and 92b. Thereby, the p-side metal pillar 23 and the n-side metal pillar 24 are formed in the openings 92a and 92b. The end portions of the p-side metal pillar 23 and the n-side metal pillar 24 exposed at the fourth face 25b serve as the p-side terminal 23a and the n-side terminal 24a, respectively.

As shown in FIG. 10B, the spacing between the p-side terminal 23a and the n-side terminal 24a provided at the fourth face 25b of the support substrate 25 is formed to be wider than the spacing between the p-side interconnection layer 21 and the n-side interconnection layer 22. For example, the spacing between the p-side terminal 23a and the n-side terminal 24a is preferably set larger than the solder spreading during a fixing process of the semiconductor light emitting device 1 on the mounting substrate. Thereby, a short circuit between the p-side terminal 23a and the n-side terminal 24a can be prevented.

Figure 11B:
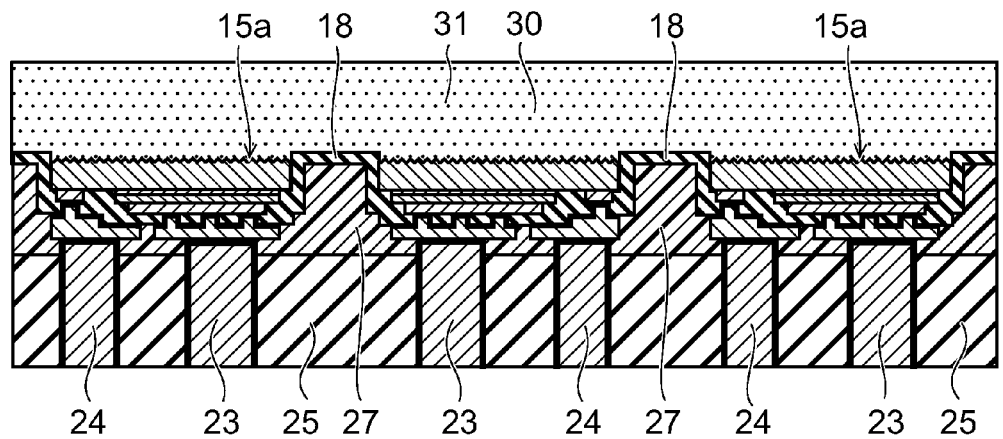

Next, the processing of the first face 15a side of the semiconductor layer 15 is performed as shown in FIG. 11A to FIG. 11B. FIG. 11A to FIG. 11B are schematic cross-sectional views showing the processes.

As shown in FIG. 11A, the substrate 10 is removed from the semiconductor layer 15. When the substrate 10 is a silicon substrate, for example, the substrate 10 can be selectively removed by wet etching. When the substrate 10 is a sapphire substrate, for example, the substrate 10 is removed using the laser lift-off method.

Structures provided on the substrate 10 are supported by the support substrate 25, and maintains a wafer shape after removing the substrate 10. A material having larger Young's modulus than the bonding layer 27 is preferably used for the support substrate 25. Thereby, it becomes possible to supperss the wafer warpage, making handling thereof easier in subsequent processes. Then, it improves the manufacturing yield and efficiency.

It may be possible to ease the stress generated between the semiconductor layer 15 and the support substrate 25 by using more flexible material, such as resin, than the semiconductor layer 15 for the bonding layer 27. For instance, the semiconductor layer 15 epitaxially grown on the substrate 10 may include the large internal stress. The p-side metal pillar 23, the n-side metal pillar 24 and the bonding layer 27 may absorb the internal stress that is released at once, when the substrate 10 is removed from the semiconductor layer 15. Thereby, it becomes possible to avoid breakage of the semiconductor layer 15 through the removing process of the substrate 10.

Next, fine unevenness is formed on the first face 15a of the semiconductor layer 15. For example, the first semiconductor layer 11 is wet-etched with a KOH (potassium hydroxide) aqueous solution, TMAH (tetramethylammonium hydroxide), or the like. In this etching, a difference in the etching rate depending on the crystal plane direction occurs. Consequently, as shown in FIG. 11A, unevenness can be formed on the first face 15a. It is also possible to form a resist mask on the first face 15a to selectively etch the first semiconductor layer 11. Thus, by forming unevenness on the first face 15a, the extraction efficiency of the emission light of the light emitting layer 13 can be improved.

Next, as shown in FIG. 11B, the phosphor layer 30 is formed on the semiconductor layer 15 and the insulating film 18. The phosphor layer 30 contains phosphor 31, and is formed using, for example, a method such as printing, potting, molding, and compression molding.

For example, epoxy or silicorn may be used as a matrix for the phosphor layer 30. The phosphor 31 is, for example, a yellow fluorescent substance that emits yellow light, a red fluorescent substance that emits red light, a green fluorescent substance that emits green light, or a mixture of them. For example, YAG, nitride or the like is also used for the phosphor 31.

Figure 12A:
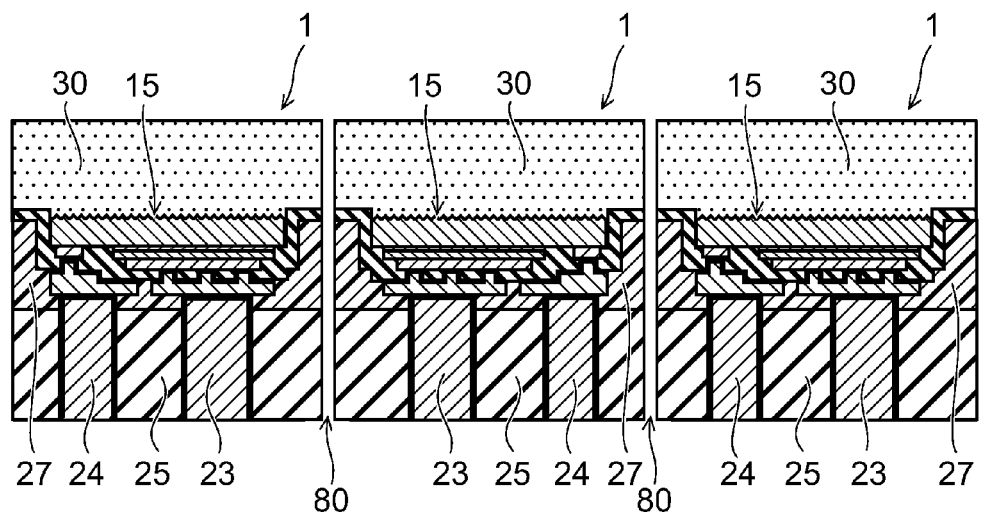
Figure 12B:
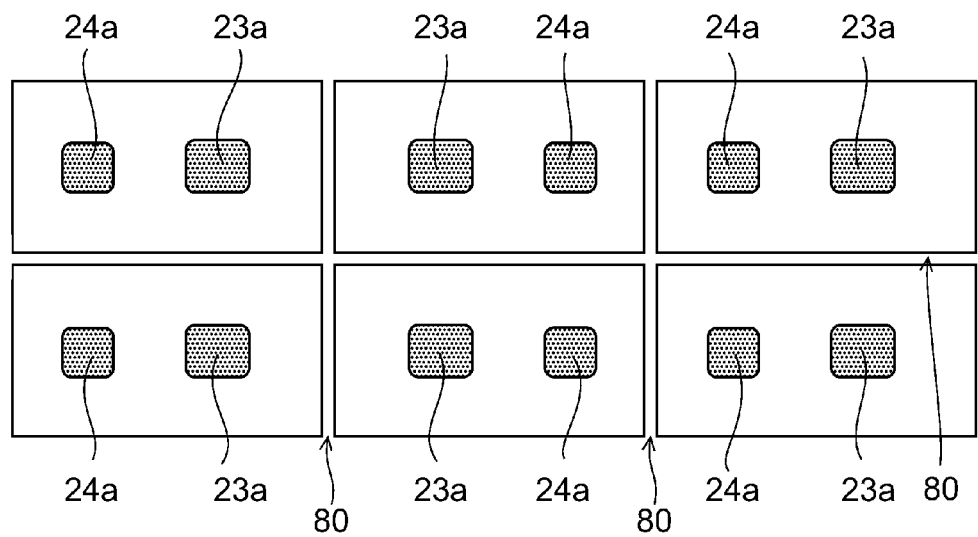

The cutting of the phosphor layer 30, the intermediate layer 36, the insulating film 18, and the insulating film 25 is performed along the groove 80 between the semiconductor layers 15 adjacent to each other, as shown in FIGS. 12A and 12B. Thereby, the semiconductor devices 1 are diced into piecies.

FIG. 12A is a cross-sectional view illustrating the semiconductor light emitting device 1, and FIG. 12B is a plan view illustrating the p-side terminal 23a and the n-side terminal 24a exposed in a face of the support substrate 25.

The phosphor layer 30, the insulating film 18, the bonding layer 27 and the support substrate 25 are cut by using a dicing blade, for example. The semiconductor layer 15 does not exist in the trench 80, and is therefore free from damage caused by dicing. On being fragmented, a structure in which the end (side face) of the semiconductor layer 15 is covered and protected by the insulating film 18 is obtained.

The semiconductor light emitting device 1 may be a single-chip structure including one semiconductor layer 15, or may be a multi-chip structure including a plurality of semiconductor layers 15.

Since the processes before dicing are performed collectively in a wafer state, there is no need to perform wiring and packaging for each diced device, and a significant cost reduction is possible. That is, at the stage of the dicing, wiring and packaging have already been performed. Therefore, the embodiment can enhance productivity and can reduce manufacturing costs.

Figure 13:
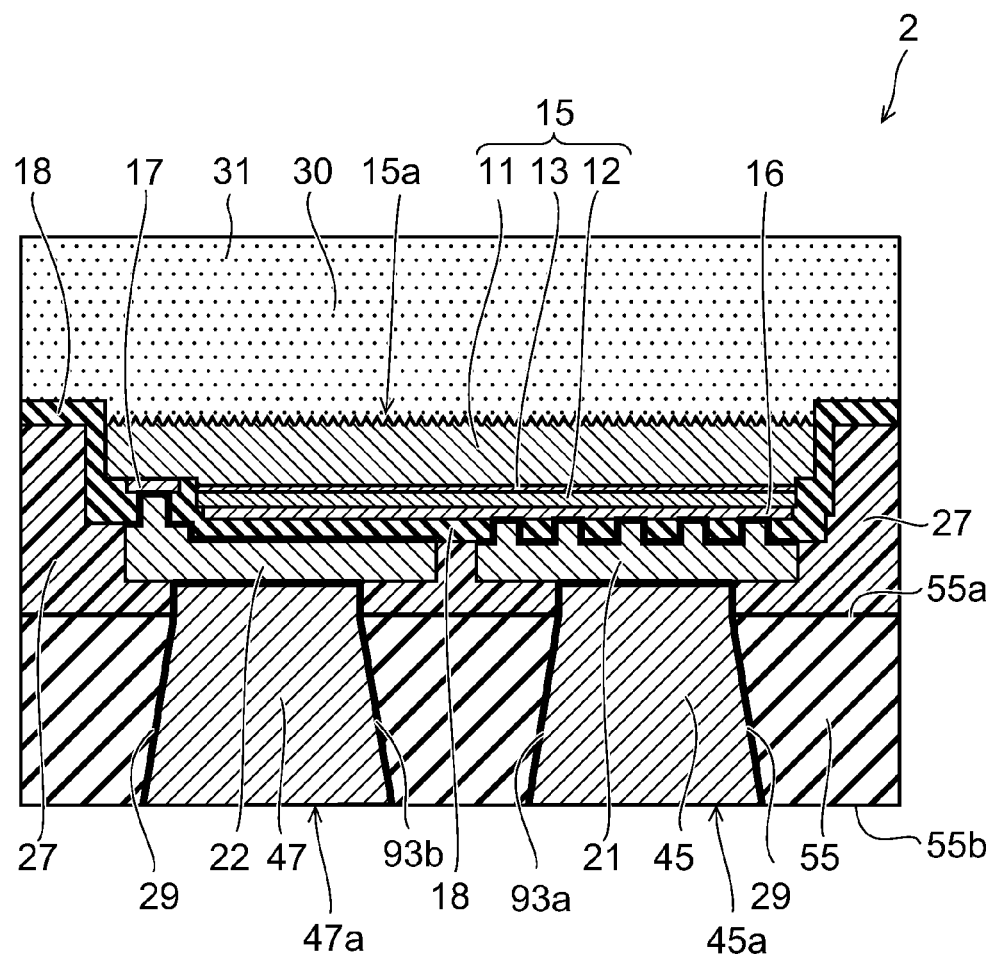
FIG. 13 is a schematic cross-sectional view showing a semiconductor light emitting device according to a first variation of the first embodiment.

FIG. 13 is a schematic cross-sectional view showing a semiconductor light emitting device 2 according to a first variation of the first embodiment. The semiconductor light emitting device 2 includes a support substrate 55. The support substrate 55 has openings 93a and 93b that become larger in the direction from a third face 55a to a forth face 55b. A p-side metal pillar 45 and an n-side metal pillar 47 buried in the openings 93a and 93b have end faces with a larger area in the fourth face 55b than the cross-section along the third face 55a. That is, a p-side terminal 45a and an n-side terminal 47a exposed at the fourth face 55b have a larger area than the portions where the p-side metal pillar 45 and the n-side metal pillar 47 are in contact with the p-side interconnection layer 21 and the n-side interconnection layer, respectively.

For example, the openings 93a and 93b have a shape becoming larger toward the fourth face 55b; thereby, the uniformity of the metal film 29 formed on the inner faces of the openings 93a and 93b is improved. The occurrence of defects such as voids can be suppressed between the p-side metal pillar 45 and the support substrate 55, and between the n-side metal pillar 47 and the support substrate 55, and the adhesion between each metal pillar and the support substrate 55 can be improved. Thereby, it may improve the reliability of the semiconductor light emitting device 2.

Figure 14A:
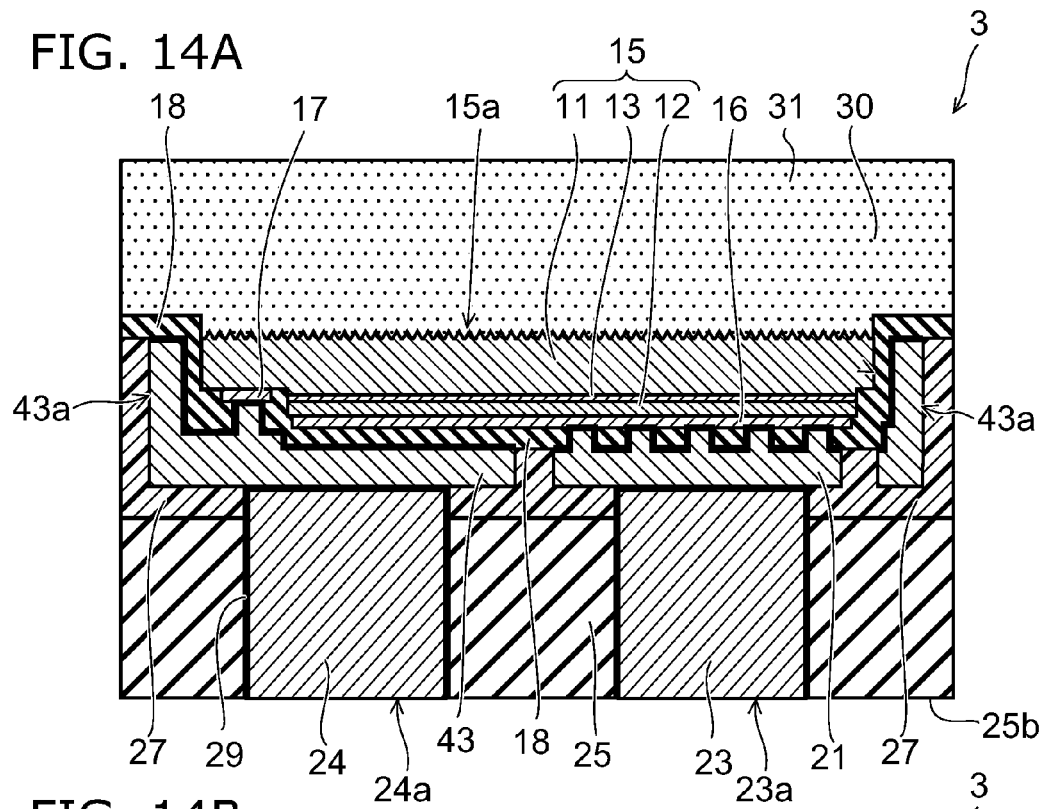
FIGS. 14A and 14B are schematic views showing a semiconductor light emitting device according to a second variation of the first embodiment.
Figure 14B:
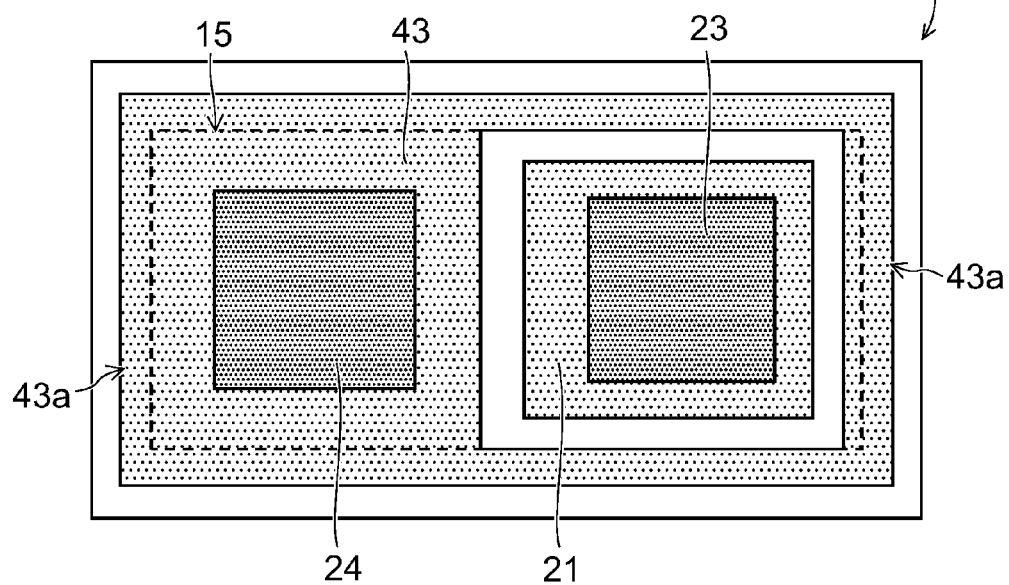

FIGS. 14A and 14B are schematic views showing a semiconductor light emitting device 3 according to a second variation of the first embodiment. FIG. 14A shows a cross-section of the semiconductor light emitting device 3, and FIG. 14B is a plan view showing the fourth face 25b side of the support substrate 25. In order to describe the p-side interconnection layer 21 and an n-side interconnection layer 43, the support substrate 25 and the bonding layer 27 are omitted in FIG. 14B. The broken line illustrated in FIG. 14B shows the outer edge of the semiconductor layer 15.

In the semiconductor light emitting device 3, the n-side interconnection layer 43 extends up to the outer periphery portion of the semiconductor layer 15. A portion 43a of the n-side interconnection layer 43 covers the side face 15c of the semiconductor layer 15, and is provided so as to surround the p-side interconnection layer 21. Thereby, part of the emitted light from the side face of the semiconductor light emitting device 3 are suppressed. That is, reducing the light not passing through the phosphor layer 30 may suppess color breakup in the light distribution characteristic.

Figure 15:
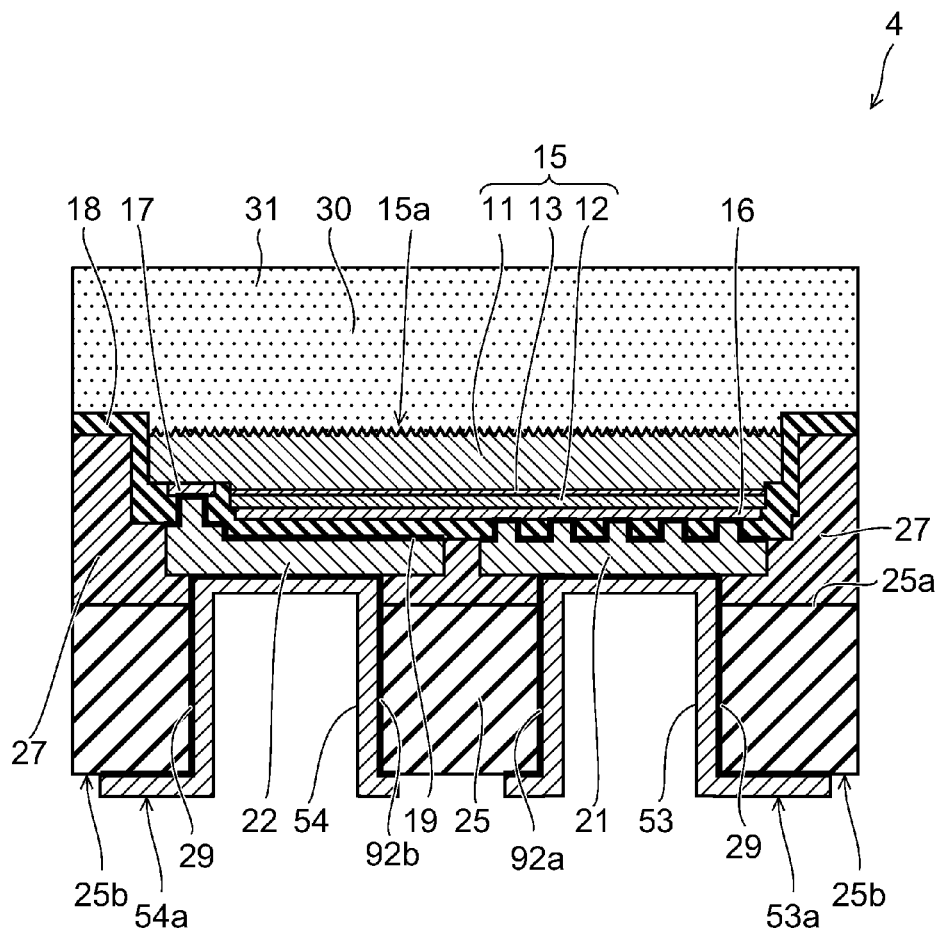
FIG. 15 is a schematic cross-sectional view showing a semiconductor light emitting device according to a third variation of the first embodiment.

FIG. 15 is a schematic cross-sectional view showing a semiconductor light emitting device 4 according to a third variation of the first embodiment. The semiconductor light emitting device 4 includes metal layers 53 and 54 covering the inner faces of the openings 92a and 92b, respectively, of the support substrate 25, and a p-side terminal 53a and an n-side terminal 54a provided on the fourth face 25b.

That is, in the variation, the interiors of the openings 92a and 92b are not filled with metal, and the p-side terminal 53a and the n-side terminal 54a are provided on the fourth face 25b. The p-side terminal 53a and the p-side interconnection layer 21 are electrically connected via the metal layer 53 provided on the inner face of the opening 92a. The n-side terminal 54a and the n-side interconnection layer 22 are electrically connected via the metal layer 54 provided on the inner face of the opening 92b.

Since the thicknesses of the metal layers 53 and 54 may be made thin, for example, the processing time of electrolytic Cu plating via the metal film 29 can be reduced to improve manufacturing efficiency. Furthermore, since the connection portions between the p-side interconnection layer 21 and the metal layer 53, and between the n-side interconnection layer 22 and the metal layer 54 become flexible as compared to the p-side metal pillar 23 and the n-side metal pillar 24, which fill up the interiors of the openings 92a and 92b, it is advantageous for relaxing stress while removing the substrate 10 and fixing the device on the mounting board.

In the semiconductor light emitting devices 3 and 4 according to the variations mentioned above, the openings 92a and 92b provided in the support substrate 25 may have a shape becoming wider from the third face 25a toward the fourth face 25b.

Figures 16A, 16B:
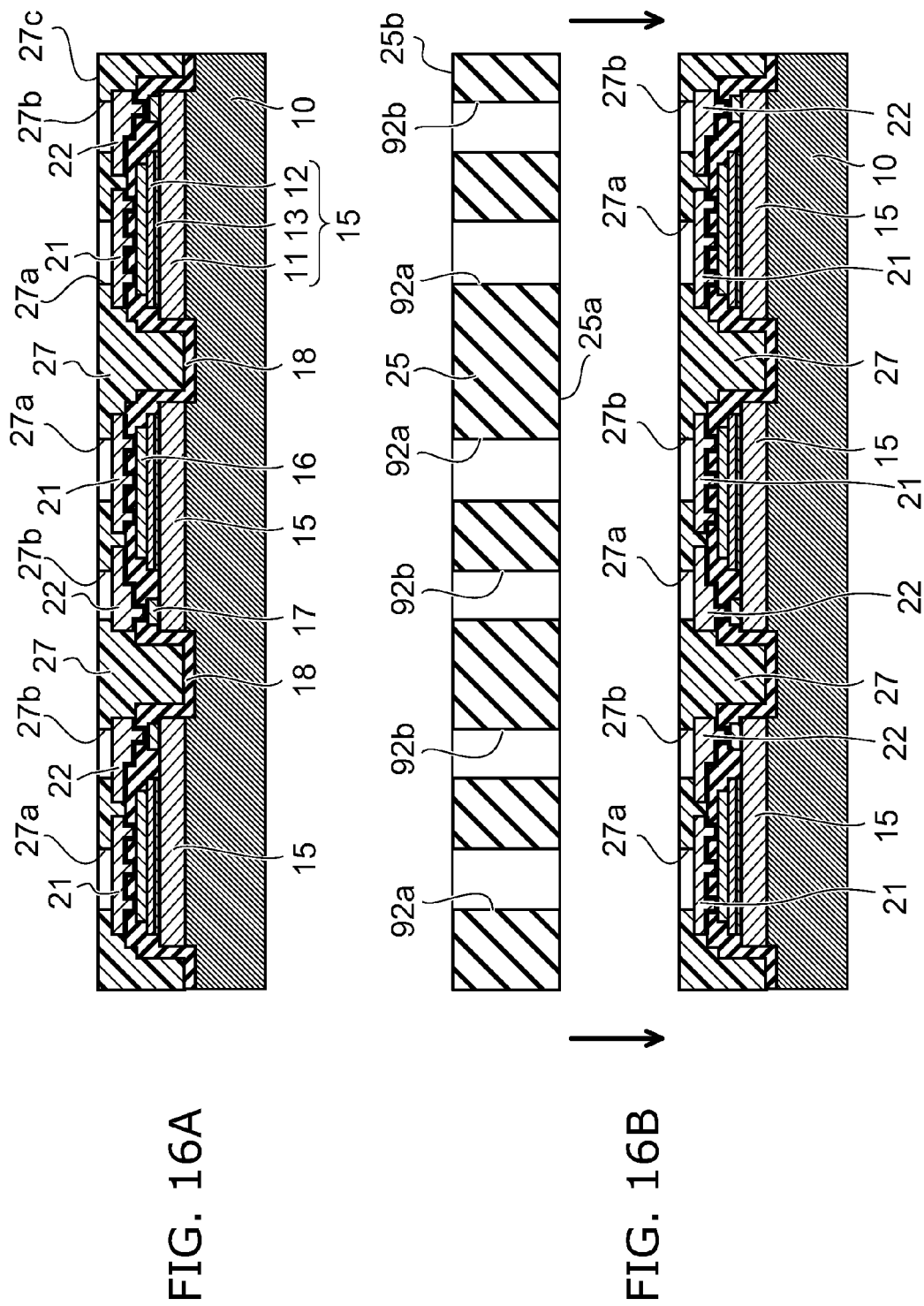
FIGS. 16A and 16B are schematic cross-sectional views showing manufacturing processes of a semiconductor light emitting device according to a variation of the first embodiment.

FIGS. 16A and 16B are schematic cross-sectional views showing the manufacturing processes of the semiconductor light emitting device 1 according to a variation of the first embodiment. FIG. 16A and FIG. 16B show the processes of attaching the support substrate 25 onto the semiconductor layer 15, the p-side interconnection layer 21, and the n-side interconnection layer 22.

In the variation, as shown in FIG. 16A, the bonding layer 27 that covers the semiconductor layer 15, the p-side interconnection layer 21, and the n-side interconnection layer 22 is formed on the substrate 10. Then, openings 27a and 27b are formed extending from the upper face of the bonding layer 27 to the p-side interconnection layer 21 and the n-side interconnection layer 22, respectively.

The bonding layer 27 is a resin layer containing an epoxy resin, a silicone, or the like as a main component. The bonding layer 27 is formed on the substrate 10 using, for example, a method such as printing, potting, molding, and compression molding. In the process shown in FIG. 16A, the bonding layer 27 is so-called "a B stage resin" in a semi-cured state.

When a resin layer having photosensitivity is used as the bonding layer 27, the openings 27a and 27b can be formed directly by photolithography. Thereby, manufacturing processes can be simplified.

Next, as shown in FIG. 16B, the support substrate 25 is pressure-bonded onto the substrate 10 via the bonding layer 27. At this time, positioning of the opening 92a and 92b provided in the support substrate 25 is made for the opening 27a and the opening 27b of the bonding layer 27 so that the opening 92a and the opening 92b may communicate with the p-side interconnection layer 21 and the n-side interconnection layer 22, respectively. Subsequently, heat treatment of a prescribed temperature is performed to cure the bonding layer 27; thus, the support substrate 25 is attached onto the semiconductor layer 15, the p-side interconnection layer 21, and the n-side interconnection layer 22.

Second Embodiment

FIG. 17A to FIG. 19B are schematic cross-sectional views showing the manufacturing processes of a semiconductor light emitting device according to a second embodiment. FIG. 17A and FIG. 17B show the processes of attaching the support substrate 25 onto the semiconductor layer 15, the p-side interconnection layer 21, and the n-side interconnection layer 22. FIG. 18A to FIG. 19B show the processes of forming the p-side terminal 53a and the n-side terminal 54a on the fourth face 25b of the support substrate 25.

As shown in FIG. 17A and FIG. 17B, the support substrate 25 is attached onto the substrate 10 via the bonding layer 27. In this stage, the support substrate 25 does not have the openings 92a and 92b. The support substrate 25 is, for example, quartz glass. The bonding layer is, for example, a semi-cured epoxy resin.

The support substrate 25 has the bonding layer 27 on the third face 25a, for example. The support substrate 25 is pressure-bonded onto the semiconductor layer 15, the p-side interconnection layer 21, and the n-side interconnection layer 22. Thereby, the bonding layer 27 is put into the spacing between adjacent semiconductor layers 15 and into the gap between the p-side interconnection layer 21 and the n-side interconnection layer 22. Subsequently, while applying pressure to the support substrate 25 and the substrate 10, a prescribed heat treatment is performed to cure the bonding layer 27.

Figure 18A:
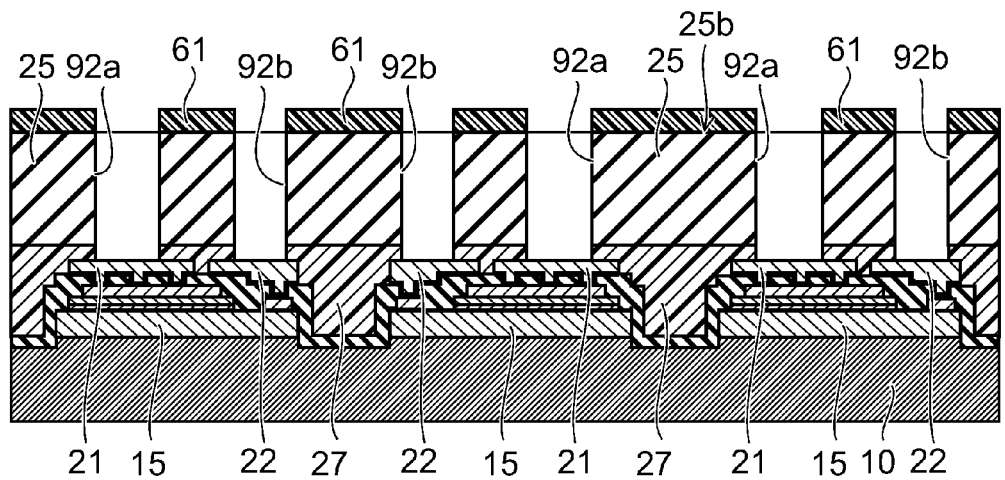

Next, as shown in FIG. 18A, for example, a resist mask 61 is formed on the fourth face 25b of the support substrate 25. The resist mask 61 has openings in positions corresponding to the p-side interconnection layer 21 and the n-side interconnection layer 22. Subsequently, the openings 92a and 92b are formed using, for example, the RIE method. The opening 92a and the opening 92b communicate with the p-side interconnection layer 21 and the n-side interconnection layer 22, respectively.

Figure 18B:
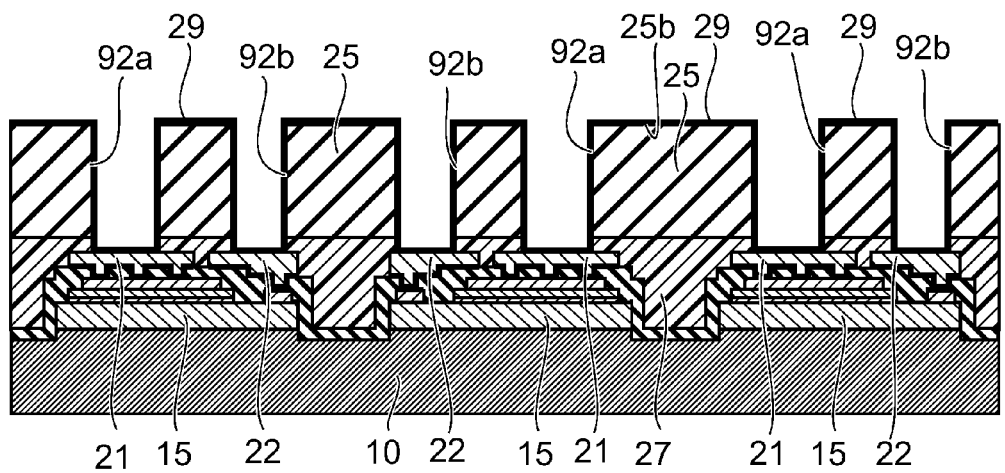

Subsequently, as shown in FIG. 18B, the metal film 29 is formed covering the fourth face 25b of the support substrate 25, the inner face of the opening 92a, and the inner face of the opening 92b.

Figure 19A:
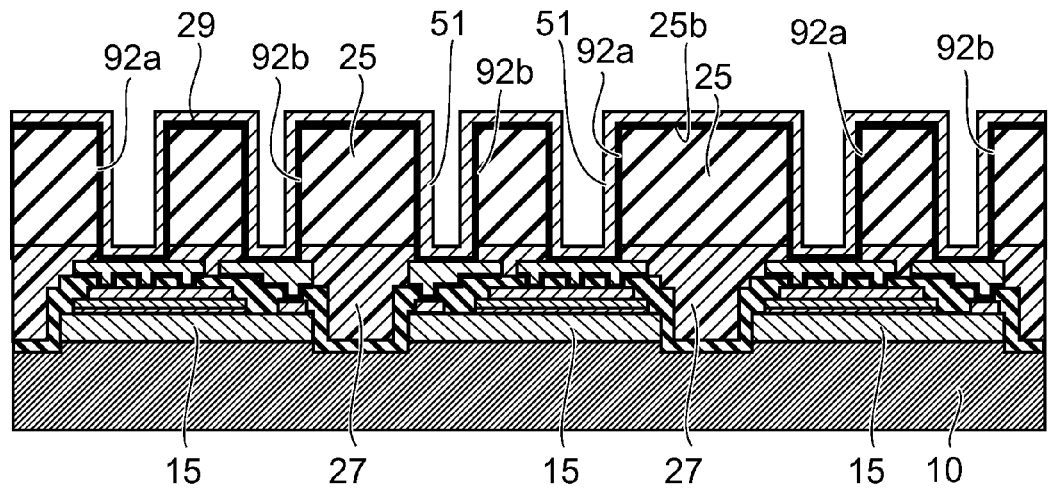

Next, as shown in FIG. 19A, the metal film 29 is used as a seed metal to perform electrolytic Cu plating to form a Cu layer 51 covering the interior of the opening 92a, the inner face of the opening 92b, and the fourth face 25b.

Figure 19B:
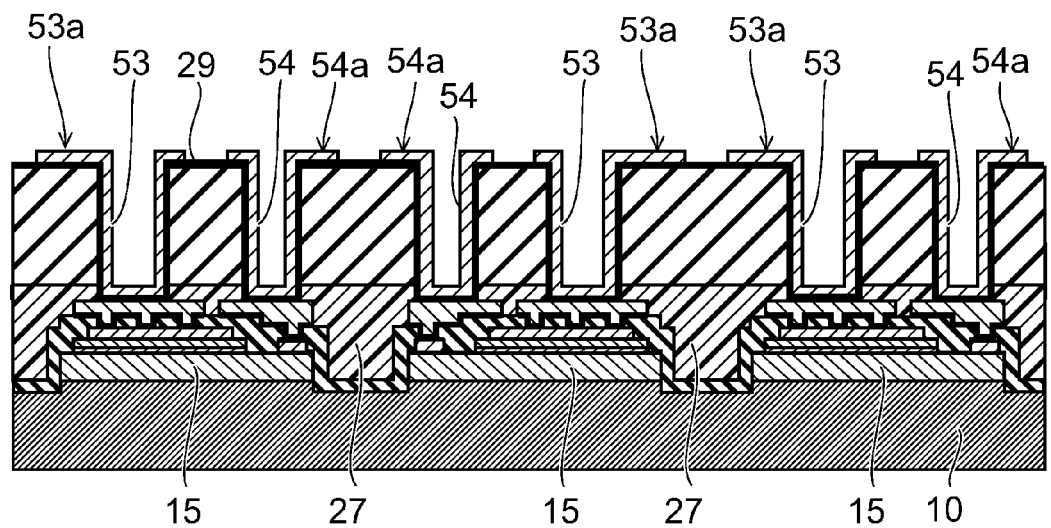

Next, as shown in FIG. 19B, for example, the Cu layer 51 and the metal film 29 formed on the forth face 25b are patterned using photolithography and are separated into the metal layer 53 and the metal layer 54. A portion of the metal layer 53 provided on the forth face 25b is the p-side terminal 53a, and a portion of the metal layer 54 provided on the forth face 25b is the n-side terminal 54a. The p-side terminal 53a is electrically connected to the p-side interconnection layer 21 via the metal layer 53. The n-side terminal 54a is electrically connected to the n-side interconnection layer 22 via the metal layer 54.

The manifacturing method of the p-side terminal 53a and the n-side terminal 54a in the embodiment is not limited to the example mentioned above, and the embodiment can be applied also to the case using, for example, the support substrate 25 in which the openings 92a and 92b are formed beforehand.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a semiconductor layer having a first face, a second face opposite to the first face, and a side face contacting the first face, the semiconductor layer including a light emitting layer;
   a first electrode provided on the semiconductor layer;
   a second electrode provided on the semiconductor layer;
   a first insulating film covering the second face and the side face and having an extended portion around the semiconductor layer, wherein the first face locates at a level that is higher than the second face and lower than an upper surface of the extended portion of the first insulating film;
   a first interconnection layer electrically connected to the first electrode through a first opening of the first insulating film;
   a second interconnection layer electrically connected to the second electrode though a second opening of the first insulating film;
   a support substrate facing the first insulating film, a portion of the first interconnection layer, and a portion of the second interconnection layer;
   a bonding layer provided between the support substrate and the first insulating film;
   a first terminal electrode which extends through and contacts the support substrate and the bonding layer, and which is electrically connected to the first interconnection layer; and
   a second terminal electrode which extends through and contacts the support substrate and the bonding layer, and which is electrically connected to the second interconnection layer.

2. The device according to claim 1, further comprising a phosphor layer provided on the first face side, the phosphor layer containing phosphor excited by light emitted from the light emitting layer,
   wherein a peak wavelength of light spectrum emitted from the phosphor is longer than a peak wavelength of light spectrum emitted from the light emitting layer.

3. The device according to claim 1, wherein:
   the semiconductor layer includes a p-type semiconductor layer and an n-type semiconductor layer,
   the light emitting layer is provided between the p-type semiconductor layer and the n-type semiconductor layer, and
   the first electrode is in contact with the p-type semiconductor layer and the second electrode is in contact with the n-type semiconductor layer.

4. The device according to claim 1, wherein the first terminal electrode contacts with the first interconnection layer inside an outer edge of the first interconnection layer, and the second terminal electrode contacts with the second interconnection layer inside an outer edge of the second interconnection layer.

5. The device according to claim 1, wherein the first terminal electrode comprises a first metal pillar extending through the support substrate and the bonding layer, and the second terminal electrode comprises a second metal pillar extending through the support substrate and the bonding layer.

6. The device according to claim 1, wherein:
   the first terminal electrode comprises a metal layer provided on an inner face of an opening which is formed through the support substrate and the bonding layer and communicates with the first interconnection layer,
   the second terminal electrode comprises a metal layer provided on an inner face of an opening which is formed through the support substrate and the bonding layer and communicates with the second interconnection layer, and
   each of the first terminal electrode and the second terminal electrode extends onto a surface of the support substrate which opposes a surface thereof that is in contact with the bonding layer.

7. The device according to claim 1, wherein the first terminal electrode and the second terminal electrode widen in a direction from the bonding layer to the support substrate.

8. The device according to claim 1, wherein the bonding layer includes a resin, and has a smaller Young's modulus than the support substrate.

9. The device according to claim 8, wherein the bonding layer at an outer periphery of the semiconductor layer is thicker than a portion including the semiconductor layer, the first electrode, and the first interconnection layer.

10. A semiconductor light emitting device comprising:
    a semiconductor layer having a first face, a second face opposite to the first face, and a side face contacting the first face, the semiconductor layer including a light emitting layer;
    a first electrode provided on the semiconductor layer;
    a second electrode provided on the semiconductor layer;
    a first insulating film covering the second face and the side face of the semiconductor layer;
    a first interconnection layer provided on the second face and the side face of the semiconductor layer via the first insulating film, the first interconnection layer being electrically connected to the first electrode through a first opening formed in the first insulating film;
    a second interconnection layer electrically connected to the second electrode through a second opening formed in the first insulating film;
    a support substrate facing the first insulating film, a part of the first interconnection layer, and a part of the second interconnection layer;
    a bonding layer provided between the support substrate and the first insulating film;
    a first terminal electrode which extends through and contacts the support substrate and the bonding layer, the first terminal electrode being electrically connected to the first interconnection layer; and
    a second terminal electrode which extends through and contacts the support substrate and the bonding layer, the second terminal electrode being electrically connected to the second interconnection layer.

* * * * *